(12) United States Patent
Kai et al.

(10) Patent No.: US 8,115,248 B2
(45) Date of Patent: Feb. 14, 2012

(54) SEMICONDUCTOR DEVICE AND METHOD FOR MANUFACTURING THE SAME

(75) Inventors: Tetsuya Kai, Yokohama (JP); Ryuji Ohba, Kawasaki (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 421 days.

(21) Appl. No.: 12/388,966

(22) Filed: Feb. 19, 2009

(65) Prior Publication Data

US 2009/0212349 A1    Aug. 27, 2009

(30) Foreign Application Priority Data

Feb. 21, 2008  (JP) ................... 2008-040642

(51) Int. Cl.
*H01L 21/331* (2006.01)
(52) U.S. Cl. ........................ 257/321; 438/257
(58) Field of Classification Search .............. 438/201, 438/257, 258, 266; 257/316, 321, 322, E21.21, 257/E29.305
See application file for complete search history.

(56) References Cited

U.S. PATENT DOCUMENTS

| 6,060,743 | A  | * | 5/2000  | Sugiyama et al. | 257/321 |
| 6,090,666 | A  | * | 7/2000  | Ueda et al.     | 438/257 |
| 6,958,265 | B2 | * | 10/2005 | Steimle et al.  | 438/211 |
| 7,186,616 | B2 | * | 3/2007  | Rao et al.      | 438/257 |
| 7,361,543 | B2 | * | 4/2008  | Steimle et al.  | 438/201 |
| 7,989,876 | B2 | * | 8/2011  | Yasuda          | 257/324 |

FOREIGN PATENT DOCUMENTS

JP       2003-78050       3/2003

* cited by examiner

*Primary Examiner* — David Vu
(74) *Attorney, Agent, or Firm* — Finnegan, Henderson, Farabow, Garrett & Dunner, L.L.P.

(57) ABSTRACT

A semiconductor device includes a semiconductor substrate, and a nonvolatile memory cell provided on the semiconductor substrate, the nonvolatile memory cell including a tunnel insulating film provided on a surface of the semiconductor substrate, the tunnel insulating film including semiconductor grains, the semiconductor grains included in both end portions of the tunnel insulating film having smaller grain size than the semiconductor grains included in other portions of the tunnel insulating film, a charge storage layer provided on the tunnel insulating film, an insulating film provided on the charge storage layer, and a control gate electrode provided on the insulating film.

10 Claims, 7 Drawing Sheets

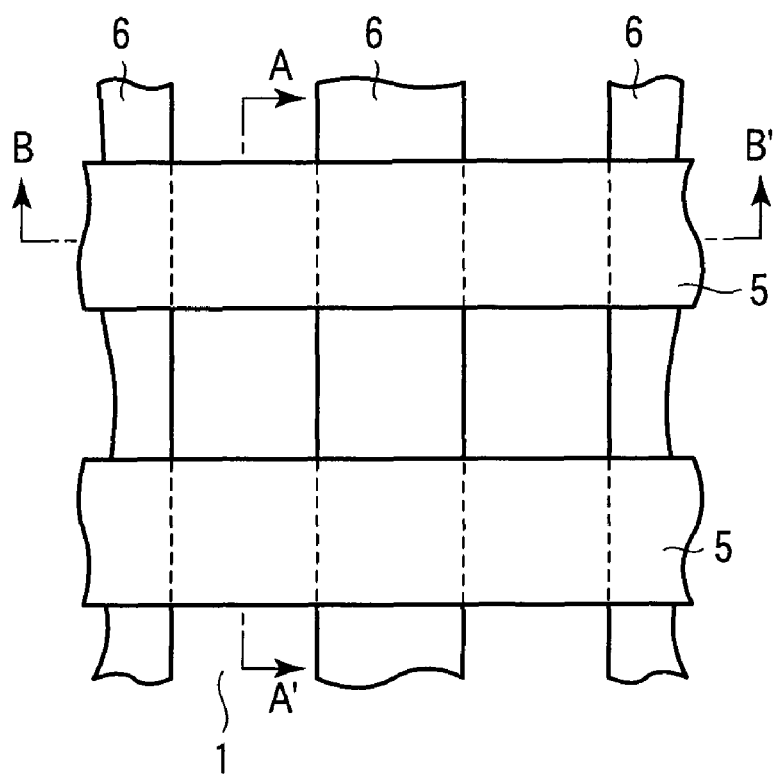
F I G. 1
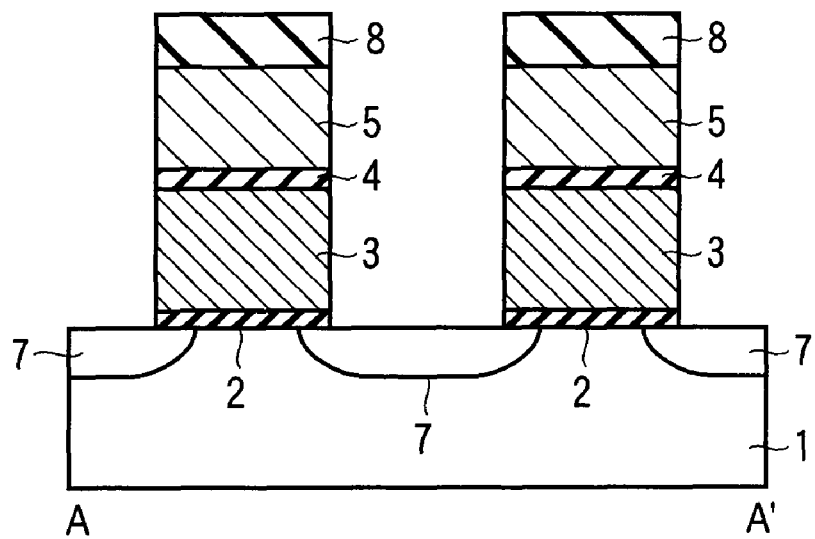
F I G. 2

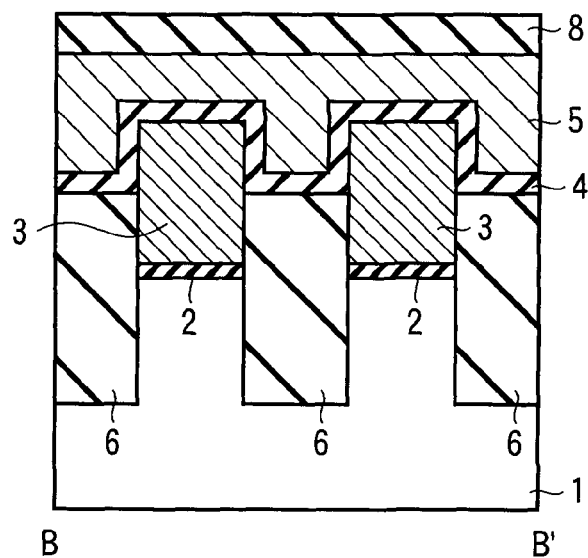
F I G. 3
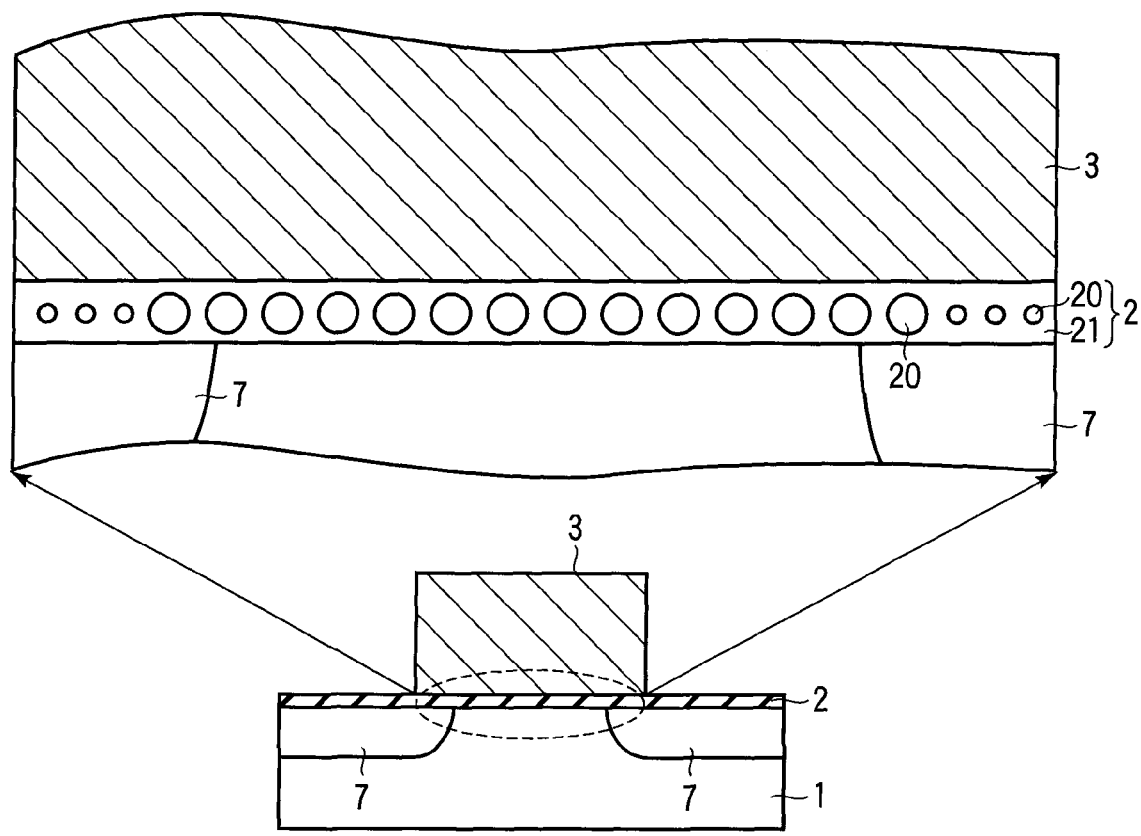
F I G. 4

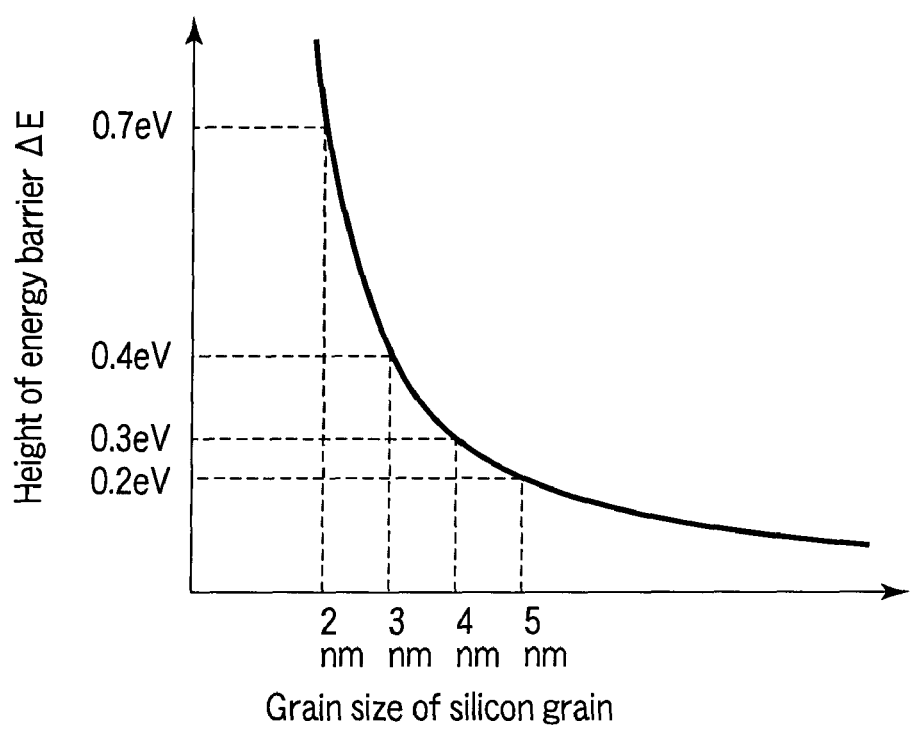
F I G. 7
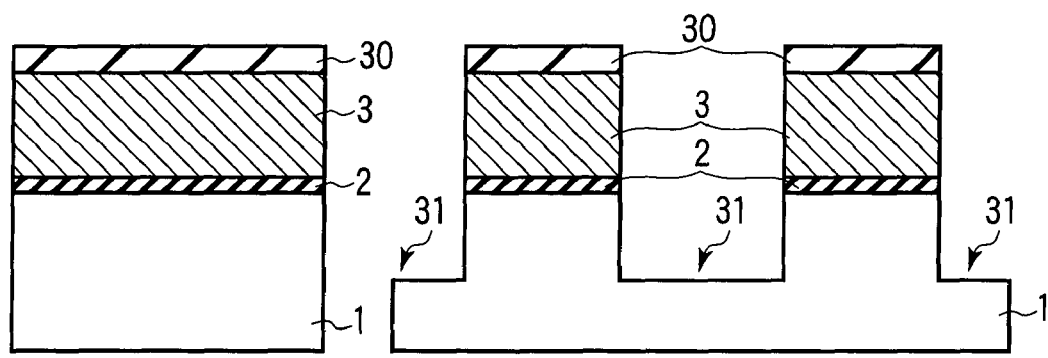
F I G. 8A  F I G. 8B

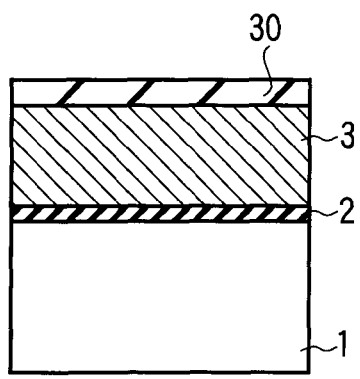
F I G. 9A
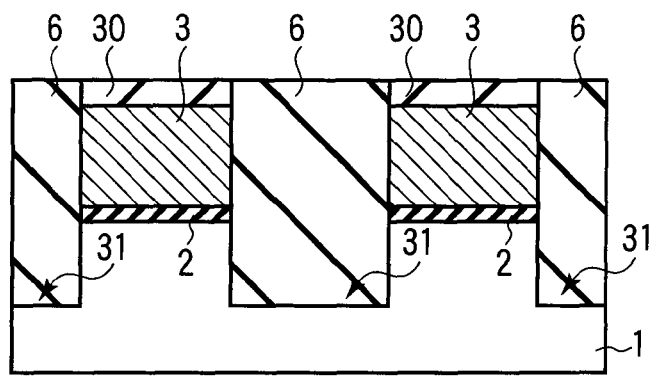
F I G. 9B
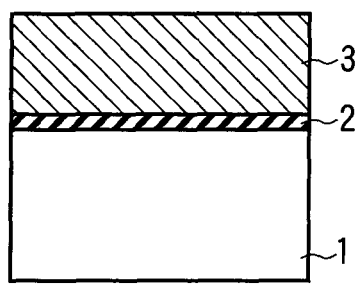
F I G. 10A
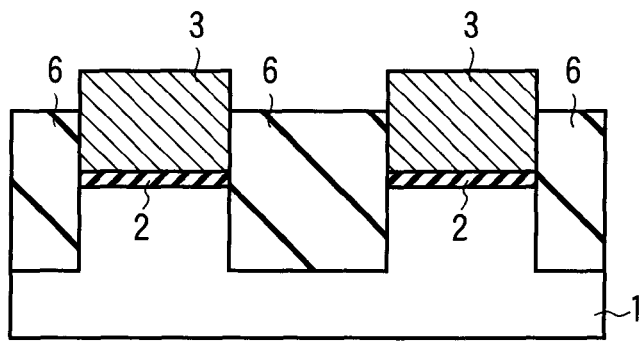
F I G. 10B

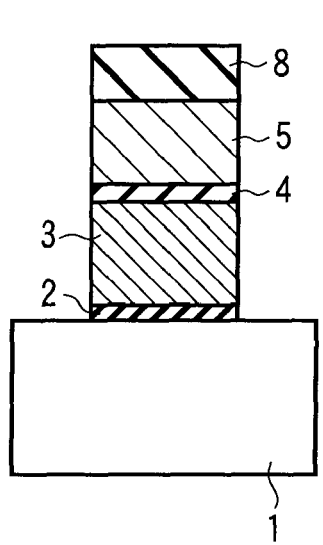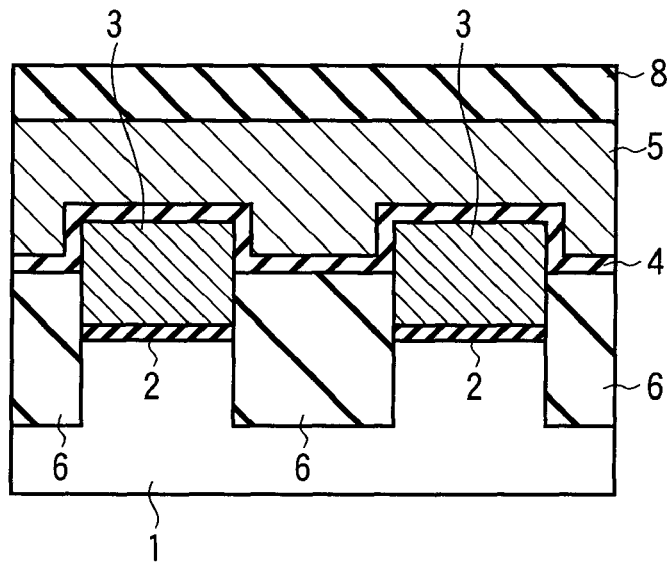
FIG. 11A　　　　　　　　FIG. 11B
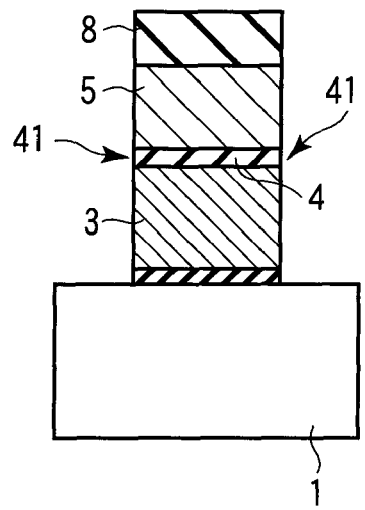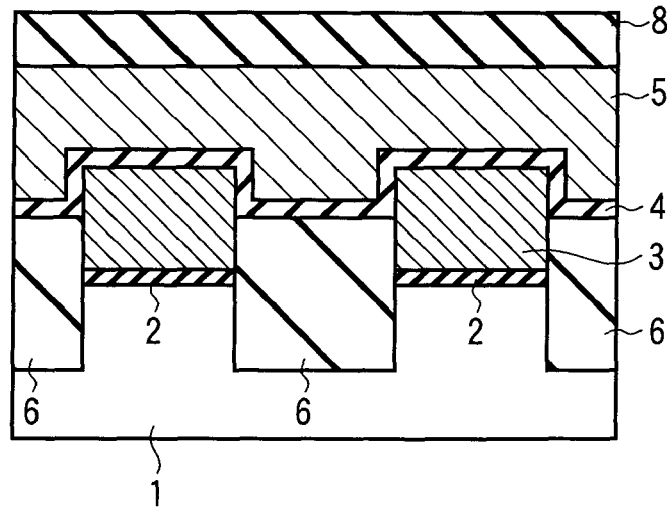
FIG. 12A　　　　　　　　FIG. 12B

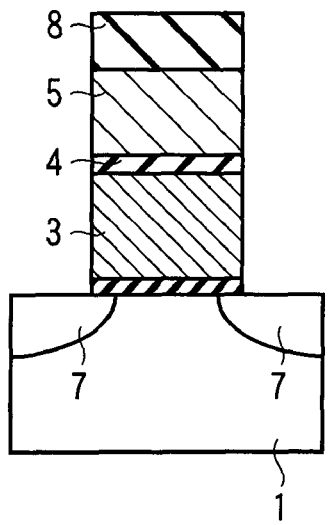
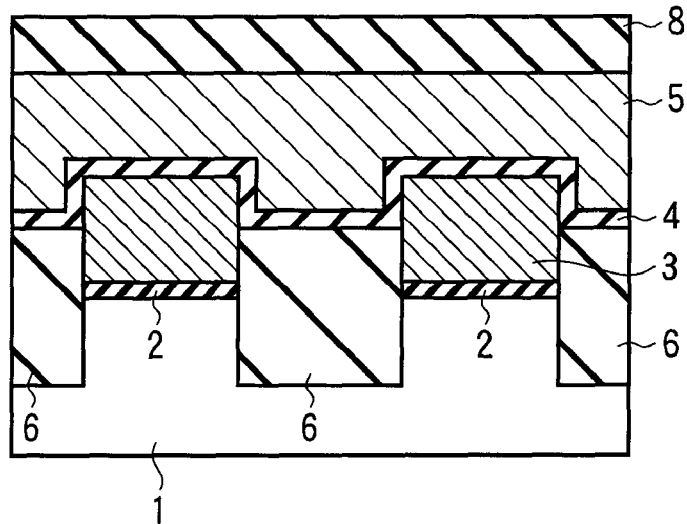
F I G. 13A          F I G. 13B
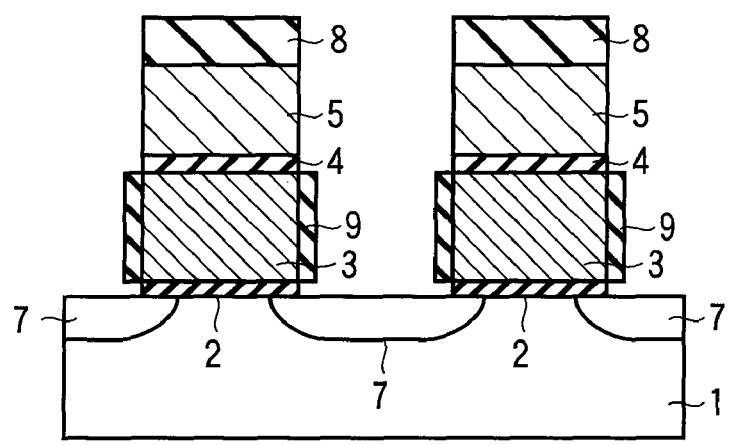
F I G. 14

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2008-040642, filed Feb. 21, 2008, the entire contents of which are incorporated herein by reference.

BACKGROUND OF THE INVENTION

1. Field of the Invention

The present invention relates to a semiconductor device comprising an electrically rewritable nonvolatile memory cell and method for manufacturing the same.

2. Description of the Related Art

In a nonvolatile semiconductor device comprising a floating gate electrode, the voltage of control electrode controls the voltage of floating gate electrode through a coupling capacitance between the floating gate and the control gate electrode.

When the semiconductor substrate is connected to ground, the voltage Vfg of the floating gate electrode is represented by $$Vfg = C1/(C1+C2) \times Vcg$$

where C1 is the capacitance between the floating and control gate electrodes, C2 is the capacitance between the floating gate electrode and the semiconductor substrate, and Vcg is the voltage of the control gate electrode. C1/(C1+C2) is called the coupling ratio.

If the dimensions of device structure are further scaled down in the future, a parasitic capacitance (α) will be produced between adjacent cells. In this case, Vfg is represented by $$Vfg = C1/(C1+C2+\alpha) \times Vcg$$

Thus, the coupling ratio is reduced.

If the coupling ratio is reduced, it is required to apply a higher voltage to the control gate electrode in order to carry out a rewrite operation (memory write/erase operation).

However, when the voltage (rewrite voltage) applied to the control electrode is raised for rewrite operation, the rate of degradation of inter-poly insulating film increases. The degradation of the inter-poly insulating film results in dielectric breakdown, an increase in leakage current, and a decrease in reliability.

In order to lower the rewrite voltage and avoid the degradation of the inter-poly insulating film, it is required to enhance the charge injection efficiency of a tunnel insulating film. As a method to increase the charge injection efficiency of the tunnel insulating film, it has been proposed to cause the tunnel insulating film formed of silicon oxide to contain grains of silicon (Jpn. Pat. Appln. KOKAI Publication No. 2003-78050). When the tunnel insulating film is allowed to contain grains of silicon, its charge injection efficiency increases owing to the electron confinement effect.

However, the above method has the following problem.

The gate portion (the tunnel insulating film, the floating gate electrode, the inter-poly insulating film, and the control electrode) of a transistor is formed through dry etching. At the time of the dry etching, the sidewall of the gate portion is damaged by plasma and film quality of the sidewall of the tunnel insulating film is deteriorated. The tunnel insulating film is subjected to charge injection stress. The charge injection stress causes leakage current (stress-induced leakage current) to occur at the sidewall having the deteriorated film quality of the tunnel insulating film. This leakage current causes electrons in the floating gate electrode to flow out, which results in a degradation of charge retention characteristic.

BRIEF SUMMARY OF THE INVENTION

According to an aspect of the present invention, there is provided a semiconductor device comprising: a semiconductor substrate; and a nonvolatile memory cell provided on the semiconductor substrate, the nonvolatile memory cell comprising: a tunnel insulating film provided on a surface of the semiconductor substrate, the tunnel insulating film including semiconductor grains, the semiconductor grains included in both end portions of the tunnel insulating film having smaller grain size than the semiconductor grains included in other portions of the tunnel insulating film; a charge storage layer provided on the tunnel insulating film; an insulating film provided on the charge storage layer; and a control gate electrode provided on the insulating film.

According to an aspect of the present invention, there is provided a method for manufacturing a semiconductor device, the semiconductor device comprising a semiconductor substrate, and a nonvolatile memory cell provided on the semiconductor substrate, the nonvolatile memory cell comprising a tunnel insulating film provided on a surface of the semiconductor substrate, the tunnel insulating film including semiconductor grains such that the semiconductor grains included in both end portions of the tunnel insulating film have smaller grain size than the semiconductor grains included in other portions of the tunnel insulating film, a charge storage layer provided on the tunnel insulating film, an insulating film provided on the charge storage layer, and a control gate electrode provided on the insulating film, the method comprising: forming a tunnel insulating film on a surface of the semiconductor substrate, the tunnel insulating film including semiconductor grains which have approximately same grain size; and selectively decreasing grain size of the semiconductor grains included in the both end portions of the tunnel insulating film.

BRIEF DESCRIPTION OF THE SEVERAL VIEWS OF THE DRAWING

FIG. 1 is a plan view of a semiconductor device according to a first embodiment;

FIG. 2 is a sectional view taken along line 2-2' of FIG. 1;

FIG. 3 is a sectional view taken along line 3-3' of FIG. 1;

FIG. 4 is a sectional view showing a structure of a tunnel insulating film of the embodiment in a channel length direction;

FIG. 7 shows the relationship between silicon grain size and energy barrier in the tunnel insulating film containing grains of silicon;

FIGS. 8A and 8B are sectional views for explaining a method for manufacturing semiconductor device of the first embodiment;

FIGS. 9A and 9B are sectional views for explaining the method for manufacturing semiconductor device of the first embodiment following FIGS. 8A and 8B;

FIGS. 10A and 10B are sectional views for explaining the method for manufacturing semiconductor device of the first embodiment following FIGS. 9A and 9B;

FIGS. 11A and 11B are sectional views for explaining the method for manufacturing semiconductor device of the first embodiment following FIGS. 10A and 10B;

FIGS. 12A and 12B are sectional views for explaining the method for manufacturing semiconductor device of the first embodiment following FIGS. 11A and 11B;

FIGS. 13A and 13B are sectional views for explaining the method for manufacturing semiconductor device of the first embodiment following FIGS. 12A and 12B; and FIG. 14 is a sectional view showing a semiconductor device according to a second embodiment.

DETAILED DESCRIPTION OF THE INVENTION

The embodiments of the present invention will be described hereinafter with reference to the accompanying drawings.

First Embodiment

FIG. 1 is a plan view of a semiconductor device according to a first embodiment, specifically, FIG. 1 is the plan view, which illustrates a plurality of nonvolatile memory cells (hereinafter referred to simply as memory cells) that constitute a memory cell array in the semiconductor device.

FIG. 2 is a sectional view (sectional view along the channel length direction) taken along line 2-2' of FIG. 1 and FIG. 3 is a sectional view (sectional view along the channel width direction) taken along line 3-3' of FIG. 1.

The memory cell array constitutes a NAND flash memory. Specifically, the semiconductor device is adapted for use in electronic equipment, such as a music playback device, which is equipped with a nonvolatile memory.

Each memory cell includes a tunnel insulating film, a floating gate electrode, a control gate electrode, an interelectrode insulating film, and source/drain regions. The memory cell of the present embodiment will be further described hereinafter.

An isolation trench is provided on a silicon substrate 1, the isolation trench is filled with isolation insulating film 6. The isolation trench and the isolation insulating film 6 constitute isolation region (STI). The isolation region defines an active area in the silicon substrate 1 which contains the channel region of the memory cell.

Figure 5:
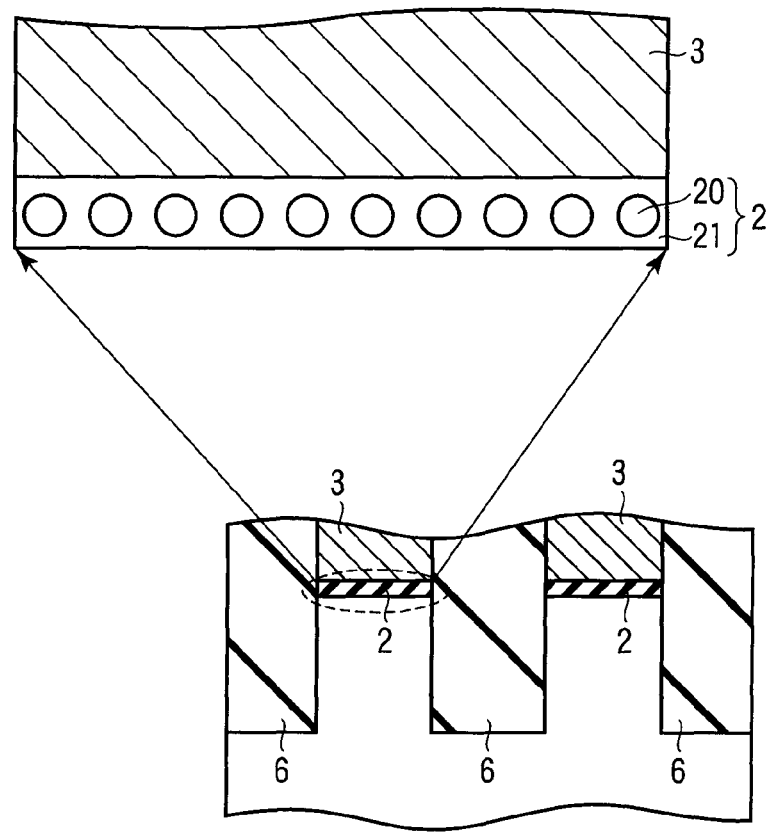
FIG. 5 is a sectional view showing a structure of the tunnel insulating film of the embodiment in a channel width direction.

A tunnel insulating films 2 are provided on the active area. As shown in FIGS. 4 and 5, the tunnel insulating film 2 is formed from a silicon oxide layer 21 that contains grains 20 of silicon. In the present embodiment, as shown in FIG. 4, in the channel length direction, the silicon grains 20 in the both end portions of the silicon oxide film 21 have smaller grain size than the silicon grains 20 in other portion of the silicon oxide film 21. On the other hand, in the channel width direction, as shown in FIG. 5, the silicon grains have approximately same grain size.

Figure 6:
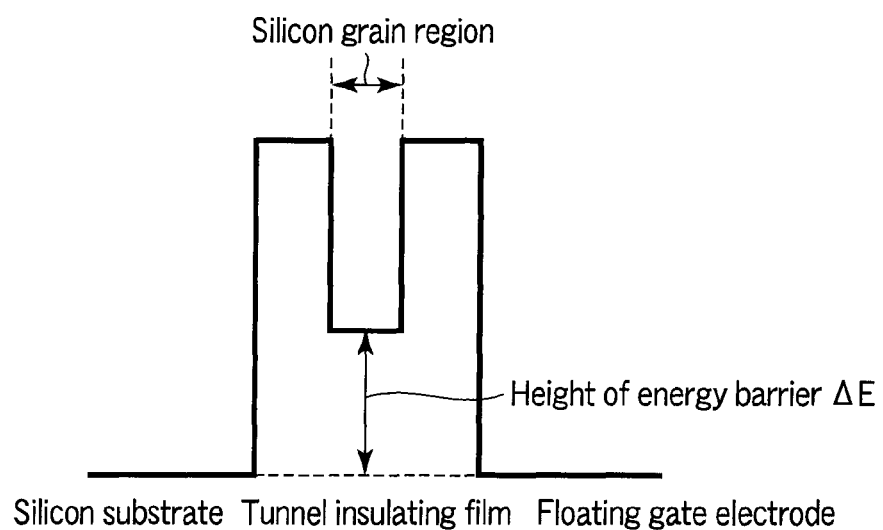
FIG. 6 shows an energy band of a tunnel insulating film containing grains of silicon.

As in the present embodiment, if the region that includes silicon grains (silicon grain region) exists in the tunnel insulating film, as shown in FIG. 6, due to the electron confinement effect of the silicon grain, an energy barrier having a height of $\Delta E$ from a bottom of conduction band of the silicon substrate is produced in an energy band of electron of the tunnel insulating film. This energy barrier $\Delta E$ allows the charge injection efficiency of the tunnel insulating film to be increased while suppressing the occurrence of leakage current in a low electric field. The height of the energy barrier $\Delta E$ depends upon the grain size of silicon grains as shown in FIG. 7.

From the standpoint of suppressing leakage current, it is desirable that no silicon grains exist in the both end portions of the tunnel insulating film. However, when the silicon grains do not exist at all in the both end portions of the tunnel insulating film, the improvement of charge injection efficiency by the electron confinement effect cannot be expected in the both end portions of the tunnel insulating film. Accordingly, in order to increase the charge injection efficiency while suppressing the occurrence of leakage current, it is required to set the grain size of the silicon grains 20 smaller in the both end portions of the silicon oxide layer 21 than in its central portion as in the present embodiment.

The both end portions of the tunnel insulating film 2 is damage by RIE (reactive ion etching) process in the course of manufacturing. Since the grain size of the silicon grains existing in the damaged portions of the tunnel insulating film is small, the energy barrier $\Delta E$ is high. Therefore, it becomes possible to suppress the occurrence of leakage current (stress-induced leakage current) due to the gate sidewall being subjected to charge injection stress. Thereby, the problem of degradation of charge retention characteristic is solved as the loss of electrons in the floating gate electrode 8 caused by the leakage current in the gate sidewall is suppressed. Therefore, according to the present embodiment, the charge injection efficiency can be enhanced without degrading the charge retention characteristic.

The floating gate electrode 3 is provided on the tunnel insulating film 2. The control gate electrode 5 is provided above the floating gate electrode 3. The interelectrode insulating film 4 is provided between the floating and control gate electrodes 3 and 5. A silicon nitride film 8 used as a mask for processing is provided on the control gate electrode 5. Insulating films other than the silicon nitride film 8 may be used as masks for processing.

Reference is now made to FIGS. 8A and 8B through 13A and 13B to describe the method for manufacturing the semiconductor device according to the first embodiment. FIGS. 8A through 13A are sectional views in the bit line direction (the channel length direction). FIGS. 8B through 13B are sectional views in the word line direction (the channel width direction).

[FIGS. 8A and 8B]

A silicon oxide film containing silicon grains as the tunnel insulating film 2 is formed on a surface of the silicon substrate 1. At this stage, the grain size of the silicon grains is approximately same both in the channel length direction and in the channel width direction. One example of such silicon grains is quantum dots comprising Si dots (Jpn. Pat. Appln. KOKAI Publication No. 2003-78050). Another example is a Si cluster. A method of forming a silicon oxide film containing Si clusters is, for example, to subject SiOx having non-stoichiometric composition to a heat treatment at 300 to 110° C. for about one hour in a nitrogen ambient.

A polycrystalline silicon film 3 to be processed into the floating gate electrode and a mask material 30 for isolation process are deposited in sequence by chemical vapor deposition (CVD) method. The mask material 30, the polycrystalline silicon film 3 and the tunnel insulating film 2 are etched in sequence by RIE process using a first resist mask (not shown). Furthermore, the exposed areas of the silicon substrate 1 are etched to form isolation trench 31. At this stage, the shape of the floating gate electrode in the channel width direction is determined.

[FIGS. 9A and 9B]

An isolation insulating film (e.g., silicon oxide layer) 6 is deposited over the entire surface to fill the isolation trench 31, thereafter, the isolation insulating film 6 in the surface portion is removed by chemical mechanical polishing (CMP) process to planarize the surface. At this time, the masking material 30 is exposed.

[FIGS. 10 and 10B]

The masking material 30 is selectively etched away and moreover the exposed surface of the isolation insulating film 6 is etched away, thereby, the upper sidewall of the polycrystalline silicon film 3 is exposed. These removals by etching are carried out by using chemicals, for example.

[FIGS. 11A and 11B]

The interelectrode insulating film 4 is formed over the entire surface by CVD process. A polycrystalline silicon film 5 to be processed into the control gate electrode (word line) is formed on the interelectrode insulating film 4 by CVD process. When the floating gate electrode and the control gate electrode are made of polycrystalline silicon, the interelectrode insulating film 4 is called the inter-poly insulating film.

A silicon nitride film 8 used as a mask material at the time of RIE processing is formed on the polycrystalline silicon film 5 by CVD process.

Furthermore, the silicon nitride film 8, the interelectrode insulating film 4 and the polycrystalline silicon film 3 are subjected to etching processing by RIE process using a second resist mask (not shown) having a pattern which crosses at right angles that of the first resist mask. In this way, the control gate electrode (word line) 5 is formed and the shape and dimensions in the channel length direction of the tunnel insulating film 2 and the floating gate electrodes 3 are determined.

[FIGS. 12A and 12B]

The grain size in the both end portions of the tunnel insulating film 2 in the channel length direction of are selectively made smaller, by oxidizing the silicon grains in the both end portions in the channel length direction of the tunnel insulating film 2, in which the oxidizing is carried out by using oxygen radical 41. Other oxidation species than the oxygen radical 41 may be used, but the oxygen radical 41 has the following advantage.

That is, as the oxygen radical 41 is the oxidation specie that is easily be inactive, the diffusion of the oxygen radical 41 stops at the both end portions of the tunnel insulating film 2, thereby, the grain size of the silicon grains in the both end portions of the tunnel insulating film 2 can be selectively made smaller with ease.

Both the end portions of the tunnel insulating film 2 have been damaged by the RIE process in FIGS. 11A and 11B and their quality has deteriorated. The silicon grains existing in the damaged portions will cause the occurrence of leakage current. However, in the present embodiment, since the silicon grains existing in the damaged portions are oxidized and consequently their grain size is made smaller, the occurrence of leakage current is suppressed.

[FIGS. 13A and 13B]

The source/drain regions 7 are formed by ion implantation and annealing. Thereafter, a NAND flash memory is obtained through known processes, such as a step of forming an interlayer insulating film, a step of forming wiring layer, etc.

Second Embodiment

FIG. 14 is a sectional view showing a semiconductor device according to a second embodiment. FIG. 14 is the sectional view in the channel length direction corresponding to FIG. 2. In FIG. 14, the portions corresponding to the portions shown in the previously mentioned drawings are denoted by the same reference numerals and omitted its detail explanation.

The present embodiment is different from the first embodiment in that a silicon nitride film 9 is provided on the side surface of the floating gate electrode 3. The reason for providing the silicon nitride film 9 is to prevent the floating gate electrode 3 from being oxidized in the oxidation step for making the grain size of the silicon grains smaller in FIGS. 12A and 12B. The prevention of oxidation of the floating gate electrode 3 leads to the prevention of degradation of its performance as an electrode. The present embodiment can also provide the same advantages as the first embodiment.

One method of forming the silicon nitride film 9 is to nitride the sidewall of the floating gate electrode 3 with nitrogen radicals after the step of FIGS. 11A and 11B. Thereafter, by performing the steps of FIGS. 12A and 12B, etc., as the first embodiment, the semiconductor device of the present embodiment is obtained.

The present invention is not limited to the embodiments described above.

For example, in the first and second embodiments, the size of silicon grains is made small in the both end portions in the channel length direction of the tunnel insulating film 2, in contrast, the grain size of silicon grains may be made smaller in both end portions in the channel width direction of the tunnel insulating film. Such a structure can be obtained by, for example, carrying out the step of oxidation for making the grain size of silicon grains smaller after the step of FIGS. 8A and 8B. Furthermore, the grain size of silicon grains may be made smaller in the both ends of the tunnel insulating film in the both directions of the channel length and width.

In addition, in the second embodiment, the silicon nitride film 9 is provided on the side surface of the floating gate electrode 3 in the channel length direction, the silicon nitride film 9 may be provided on the side surface of the floating gate electrode 3 in the channel width direction. Such a structure can be obtained by, for example, nitriding the side surface of the floating gate electrode 3 by nitrogen radicals after the step of FIGS. 8A and 8B. Furthermore, the silicon nitride film 9 may be provided on the both side surfaces of the floating gate electrode 3 in the both of the channel length direction and width.

In addition, in the first and second embodiments, a silicon oxide film (insulating film) containing silicon grains (semiconductor grains) is used as the tunnel insulating film, other combination of semiconductor grains and insulating film may be used. For example, it is possible to use the combination of silicon grains and a silicon nitride film, or the combination of silicon grains and a high dielectric constant insulating film (for example, alumina film, hafnium silicate film, hafnium aluminate film, Hafnia film or lanthanum aluminate film).

In addition, the first and second embodiments are directed to the electrically rewritable nonvolatile memory cell using the floating gate electrode as a charge storage layer, the present invention may be applied to other nonvolatile memory cells, such as MONOS (Metal-Oxide-Nitride-Oxide-Semiconductor) nonvolatile memory cell in which a nitride film is used as the charge storage layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate; and
a nonvolatile memory cell provided on the semiconductor substrate,
the nonvolatile memory cell comprising:
a tunnel insulating film provided on a surface of the semiconductor substrate, the tunnel insulating film including semiconductor grains, the semiconductor grains included in both end portions of the tunnel insulating film having smaller grain size than the semiconductor grains included in other portions of the tunnel insulating film;
a charge storage layer provided on the tunnel insulating film;
an insulating film provided on the charge storage layer; and
a control gate electrode provided on the insulating film.

2. The semiconductor device according to claim 1, wherein the tunnel insulating film is a silicon oxide film including silicon grains, a silicon nitride film including silicon grains, or a high dielectric constant insulating film including silicon grains.

3. The semiconductor device according to claim 2, wherein the high dielectric constant insulating film is an alumina film, a hafnium silicate film, a hafnium aluminate film, a Hafnia film or a lanthanum aluminate film.

4. The semiconductor device according to claim 2, wherein the silicon grains are quantum dots comprising Si dots or Si clusters.

5. The semiconductor device according to claim 1, further comprising an oxidation preventing film provided on a side surface of the charge storage layer on the both end portions of the tunnel insulating film.

6. The semiconductor device according to claim 5, wherein the oxidation preventing film is provided on a side surface of charge storage layer in a channel length direction, a side surface of charge storage layer in a channel width direction or on the both side surfaces.

7. The semiconductor device according to claim 5, wherein the oxidation preventing film is a silicon nitride film.

8. The semiconductor device according to claim 1, wherein the grain size of the semiconductor grains included in the both end portions of the insulating film is smaller than the grain size of the semiconductor grains included in the other portions of the tunnel insulating in at least one direction of channel length and width directions.

9. The semiconductor device according to claim 1, wherein the nonvolatile memory cell is a NAND type nonvolatile memory cell or a MONOS type nonvolatile memory cell.

10. The semiconductor device according to claim 1, wherein the semiconductor substrate is a silicon substrate.

* * * * *